United States Patent [19]
Hwang

[11] Patent Number: 5,985,710
[45] Date of Patent: Nov. 16, 1999

[54] TWIN WELL FORMING METHOD FOR SEMICONDUCTOR DEVICE

[75] Inventor: Lee Yeun Hwang, Cheongju, Rep. of Korea

[73] Assignee: LG Semicon Co., Ltd., Choongcheongbuk-Do, Rep. of Korea

[21] Appl. No.: 09/097,389

[22] Filed: Jun. 16, 1998

[30] Foreign Application Priority Data

Dec. 29, 1997 [KR] Rep. of Korea .............................. 76819

[51] Int. Cl.⁶ .................................................. H01L 21/761
[52] U.S. Cl. ........................... 438/228; 438/420; 438/527
[58] Field of Search .................................... 438/223, 224, 438/228, 230, 232, 514, 522, 527, 529, 535, 401, 420

[56] References Cited

U.S. PATENT DOCUMENTS

| | | | |
|---|---|---|---|
| 4,584,027 | 4/1986 | Metz, Jr. et al. | 438/527 |
| 5,252,510 | 10/1993 | Lee et al. | 438/401 |
| 5,670,395 | 9/1997 | Pan | 438/228 |

*Primary Examiner*—Olik Chaudhuri
*Assistant Examiner*—Anh Duy Mai

[57] ABSTRACT

A twin well forming method for a semiconductor device includes the steps of forming a first insulation layer on a semiconductor substrate, selectively etching the first insulation layer to obtain a first insulation layer pattern and a first buffer insulation, ion-implanting first impurities through the first buffer insulation layer into the semiconductor substrate, forming a second insulation layer on the first insulation layer pattern and the first buffer insulation layer, spreading a planarizing material on the second insulation layer and applying the planarizing material to an annealing treatment to obtain a planarizing material layer, etching back the planarizing material layer and the second insulation layer to expose an upper surface of the first insulation layer pattern, forming a second buffer insulation layer by partially etching the first insulation layer pattern, ion-implanting second impurities through the second buffer insulation layer into the semiconductor substrate, removing the second insulation layer, the first buffer insulation layer and the second buffer insulation layer, and annealing the semiconductor substrate. The method prevents the upper surface of the semiconductor substrate from being stepped or becoming uneven during the twin well formation, thereby improving a product reliability.

14 Claims, 4 Drawing Sheets

TWIN WELL FORMING METHOD FOR SEMICONDUCTOR DEVICE

BACKGROUND OF THE INVENTION

1. Field of the Invention

The present invention relates to a semiconductor device, and more particularly to an improved twin well forming method for a semiconductor device which prevents an uneven surface of a semiconductor substrate during a twin well formation, thereby enhancing a product reliability.

2. Description of the Background Art

FIGS. 1A through 1H are cross-sectional views sequentially illustrating a twin well forming method for a semiconductor device according to the conventional art.

As shown in FIG. 1A, on a semiconductor substrate 1 there is formed a first silicon oxide layer 2. A silicon nitride layer 3 is formed on the first silicon oxide layer 2.

In FIG. 1B, a photoresist pattern 4 is formed on the silicon nitride layer 3. Using the photoresist pattern 4 as a mask, the silicon nitride layer 3 is etched to form a silicon nitride layer pattern 3a. At this time, an upper surface portion of the first silicon oxide layer 2 is externally exposed through the etched hole.

Then, in FIG. 1C, phosphorus ions 5 are implanted through the exposed first silicon oxide layer 2 into the semiconductor substrate 1.

As illustrated in FIG. 1D, the exposed first silicon oxide layer 2 is selectively oxidized at a high temperature to obtain a second silicon oxide layer 6. At this time, the phosphorous ions 5 implanted into the semiconductor substrate 1 drive-in downwardly in the semiconductor substrate 1.

Referring to FIG. 1E, the silicon nitride layer pattern 3a is removed by an etching.

Next, as shown in FIG. 1F, using the second silicon oxide layer 6 as a mask, boron ions 7 are implanted through the first silicon oxide layer 2 into the semiconductor substrate 1.

As shown in FIG. 1G, the semiconductor substrate 1 is annealed to drive-in the boron ions 7 downwardly in the semiconductor substrate 1. At this time, the phosphorous ions 5 are further diffused downwardly in the semiconductor substrate 1.

Finally, as shown in FIG. 1H, the first silicon oxide layer 2 and the second silicon oxide layer 6 are removed from the semiconductor substrate 1 to realize the conventional twin well formation for a semiconductor device.

However, the conventional twin well forming method for a semiconductor substrate causes an uneven, stepped surface on the semiconductor substrate, thereby deteriorating a reliability of the semiconductor device.

SUMMARY OF THE INVENTION

The present invention is directed to solve the conventional disadvantages. Accordingly, it is an object of the present invention to provide a twin well forming method for a semiconductor device which prevents the upper surface of a semiconductor substrate from being stepped during a twin well formation, thereby enhancing product reliability.

To achieve the above-described object, there is provided a twin well forming method for a semiconductor device according to the present invention which includes the steps of forming a first insulation layer on a semiconductor substrate, selectively etching the first insulation layer to obtain a first insulation layer pattern and a first buffer insulation, ion-implanting first impurities through the first buffer insulation layer into the semiconductor substrate, forming a second insulation layer on the first insulation layer pattern and the first buffer insulation layer, spreading a planarizing material on the second insulation layer and applying the planarizing material to an annealing treatment to obtain a planarizing material layer, etching back the planarizing material layer and the second insulation layer to expose an upper surface of the first insulation layer pattern, forming a second buffer insulation layer by partially etching the first insulation layer pattern, ion-implanting second impurities through the second buffer insulation layer into the semiconductor substrate, removing the second insulation layer, the first buffer insulation layer and the second buffer insulation layer, and annealing the semiconductor substrate.

Further, to achieve the above-described object, there is provided a twin well forming method for a semiconductor device according to the present invention which includes the steps of forming a first insulation layer on a semiconductor substrate, selectively etching the first insulation layer to obtain a first insulation layer pattern and a first buffer insulation, ion-implanting first impurities through the first buffer insulation layer into the semiconductor substrate, forming a second insulation layer on the first insulation layer pattern and the first buffer insulation layer, spreading a planarizing material on the second insulation layer and applying the planarizing material to an annealing treatment to obtain a planarizing material layer, etching back the planarizing material layer and the second insulation layer to expose an upper surface of the first insulation layer pattern, forming a second buffer insulation layer by partially etching the first insulation layer pattern, ion-implanting second impurities through the second buffer insulation layer into the semiconductor substrate, removing the second insulation layer, the first buffer insulation layer and the second buffer insulation layer to expose the upper surface of the semiconductor substrate, and annealing the semiconductor substrate to make a drive-in of the first impurities and the second impurities which are ion-implanted into the semiconductor substrate.

The object and advantages of the present invention will become more readily apparent from the detailed description given hereinafter. However, it should be understood that the detailed description and specific example, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to FIGS. 2A through 2H, the twin well forming method for a semiconductor device according to the preferred embodiments of the present invention will be described.

Figure 1A:
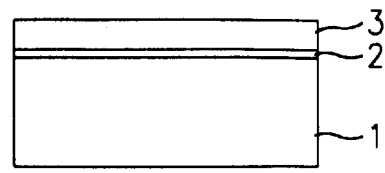
FIGS. 1A through 1H are cross-sectional views sequentially illustrating a twin well forming method for a semiconductor device according to the conventional art.
Figure 1B:
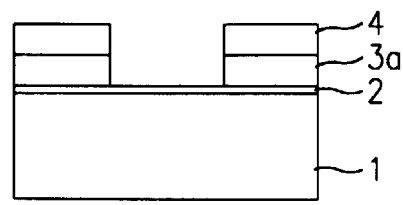
Figure 1C:
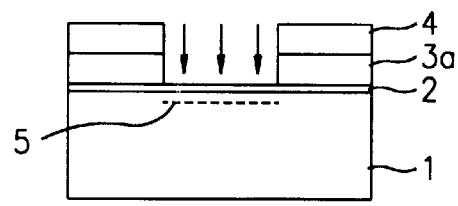
Figure 1D:
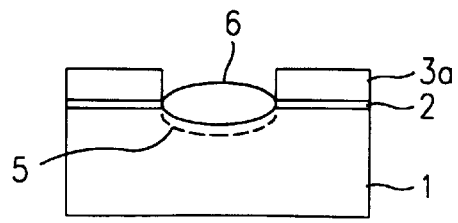
Figure 1E:
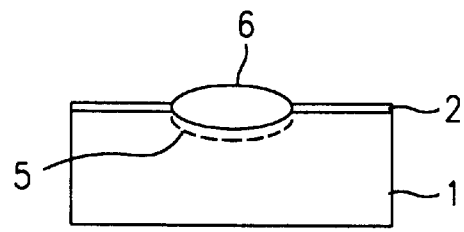
Figure 1F:
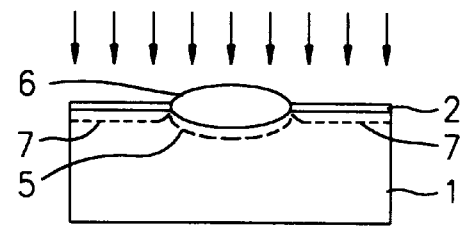
Figure 1G:
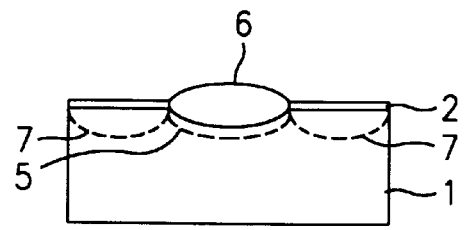
Figure 1H:
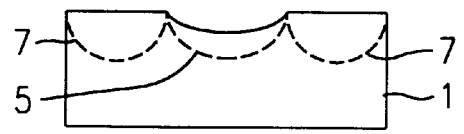
Figure 2A:
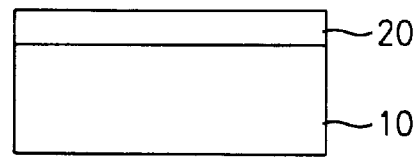
FIGS. 2A through 2H are cross-sectional views sequentially illustrating a twin well forming method for a semiconductor device according to the preferred embodiments of present invention.
Figure 2B:
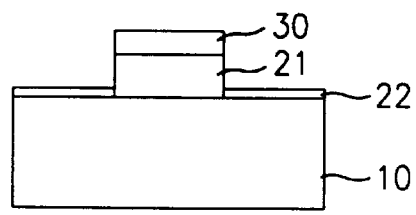

As shown in FIG. 2A, on a semiconductor substrate 10 there is formed a first insulation layer 20. As shown in FIG. 2B, a photoresist pattern 30 is formed on the first insulation layer 20. Using the photoresist pattern 30 as a mask, the first insulation layer 20 is partially etched to form a first insulation layer pattern 21 and obtain a predetermined thickness of first buffer insulation layer 22 which is left over after the partial etching of the first insulation layer 20. Here, the first insulation layer 20 is mainly formed of a silicon oxide material and the first buffer insulation layer 22 has a thickness ranging from 200 Å to 300 Å.

Figure 2C:
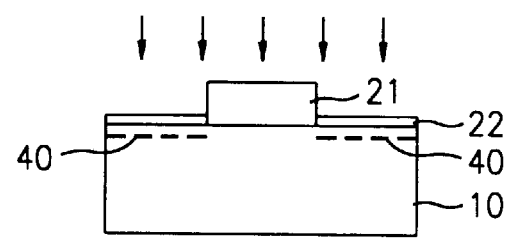

In FIG. 2C, the photoresist pattern 30 is removed. Using the first insulation layer pattern 21 as a mask, boron ions are implanted through the first buffer insulation layer 22 into the semiconductor substrate 10 to obtain a first impurity region 40. At this time, the first buffer insulation layer 22 serves as a buffer which prevents the surface of the semiconductor substrate 10 from being damaged during the boron ion implantation.

Figure 2D:
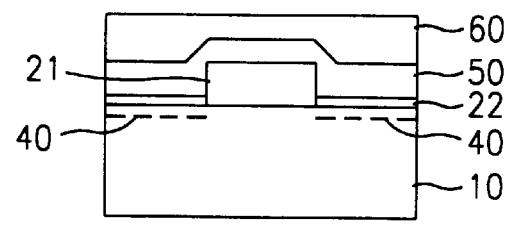

Next, as shown in FIG. 2D, a second insulation layer 50 is formed on the first insulation layer pattern 21 and the first buffer insulation layer 22. A planarizing material is spread on the second insulation layer 50, and a planarizing material layer 60 is formed by applying an annealing treatment to the planarizing material. Here, the second insulation layer 50 is mainly formed of a silicon nitride material, and the planarizing material layer 60 is mainly formed of an SOG (Spin On Glass).

Figure 2E:
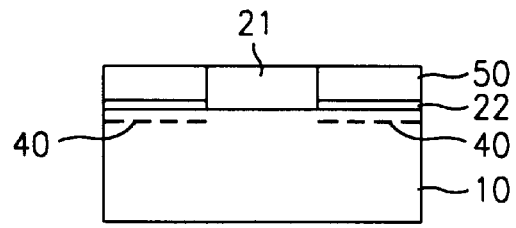

As shown in FIG. 2E, the SOG layer 60 and the second insulation layer 50 are etched back to expose the upper surface of the first insulation layer pattern 21.

Figure 2F:
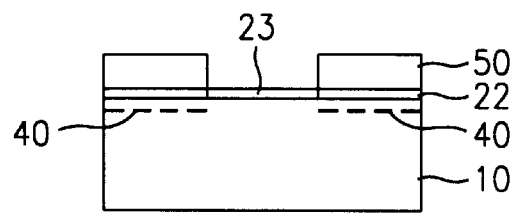

Then, as further shown in FIG. 2F, the first insulation layer pattern 21 is etched to form a second buffer insulation layer 23. Here, the second buffer insulation layer 23 is identical to the first buffer insulation layer 22 in thickness.

Figure 2G:
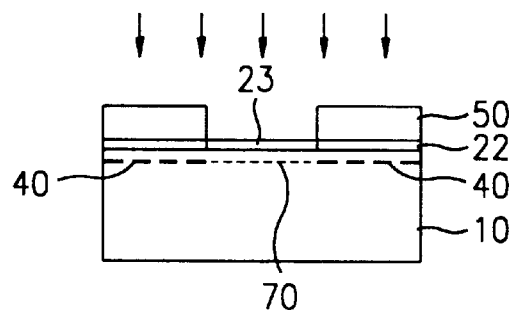

In FIG. 2G, using the second insulation layer 50 left over after the etching as a mask, phosphorous ions are implanted through the second buffer insulation layer 23 into the semiconductor substrate 10 to become a second impurity region 70.

Figure 2H:
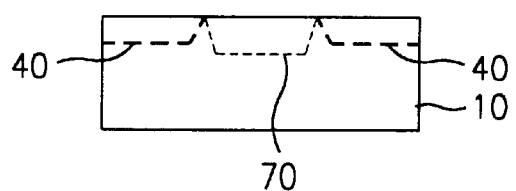

Finally, as shown in FIG. 2H, the second insulation layer 50, the first buffer insulation layer 22 and the second buffer insulation layer 23 are removed by an etching method to expose the upper surface of the semiconductor substrate 10 which is in turn applied to an annealing treatment to make a drive-in of the first impurity region 40 and the second impurity region 70 downwardly in the semiconductor substrate 10, respectively.

As described above, the twin well forming method for a semiconductor device according to the present invention prevents the upper surface of the semiconductor substrate from being stepped or becoming uneven during the twin well formation, thereby improving a reliability of the semiconductor device.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A twin well forming method for a semiconductor device, comprising the steps of:

forming a first insulation layer on a semiconductor substrate;

selectively etching the first insulation layer to obtain a first insulation layer pattern and a first buffer insulation layer;

ion-implanting first impurities through the first buffer insulation layer into the semiconductor substrate;

forming a second insulation layer on the first insulation layer pattern and the first buffer insulation layer;

forming a planarizing material layer on the second insulation layer;

etching back the planarizing material layer and the second insulation layer to expose an upper surface of the first insulation layer pattern;

forming a second buffer insulation layer by partially etching the first insulation layer pattern;

ion-implanting second impurities through the second buffer insulation layer into the semiconductor substrate;

removing the second insulation layer, the first buffer insulation layer and the second buffer insulation layer; and annealing the semiconductor substrate.

2. The twin well forming method in accordance with claim 1, wherein the first insulation layer is formed of a silicon oxide material.

3. The twin well forming method in accordance with claim 1, wherein the second insulation layer is formed of a silicon nitride layer.

4. The twin well forming method in accordance with claim 1, wherein the first buffer insulation layer and the second buffer insulation layer have a same thickness.

5. The twin well forming method in accordance with claim 4, wherein the thickness of the first buffer insulation layer and the second buffer insulation layer ranges from 200 Å to 300 Å.

6. The twin well forming method in accordance with claim 1, wherein the planarizing material layer is an SOG (Spin On Glass).

7. The twin well forming method in accordance with claim 1, wherein the first impurities are formed of an element selected from a third group or a fifth group in the periodic table of the elements.

8. The twin well forming method in accordance with claim 1, wherein the second impurities are formed of an element selected from a third group or a fifth group in the periodic table of the elements.

9. The method of claim 1, wherein the removing step removes the second insulation layer, the first buffer insulation layer and the second buffer insulation layer to expose an upper surface of the semiconductor substrate.

10. The method of claim 9, wherein the annealing step causes the first and second impurities to drive into the semiconductor substrate.

11. The method of claim 1, wherein the annealing step causes the first and second impurities to drive into the semiconductor substrate.

12. The method of claim 1, wherein the selectively etching the first insulation layer step forms first portions of the first insulation layer having a first thickness and second portions of the first insulation layer having a second thickness less than the first thickness, and the first portions are the first insulation layer pattern and the second portions are the first buffer insulation layer pattern.

13. The method of claim 1, wherein the forming a second buffer insulation layer step partially etches the first insulation layer pattern to reduce a thickness thereof.

14. The method of claim 1, wherein the forming a planarizing material layer step comprises:

forming a planarizing material on the second insulation layer; and annealing the semiconductor substrate.

* * * * *